(12) United States Patent
Greber et al.

(10) Patent No.: US 8,337,134 B2
(45) Date of Patent: Dec. 25, 2012

(54) DEVICE AND METHOD FOR STACKING AND/OR CONVEYING A PLURALITY OF FLAT SUBSTRATES

(75) Inventors: Reiner Greber, Frittlingen (DE); Marijan Strugar, VS-Schwenningen (DE); Thomas Schultze, VS-Villingen (DE)

(73) Assignee: Schmid Technology Systems GmbH (DE)

( * ) Notice: Subject to any disclaimer, the term of this patent is extended or adjusted under 35 U.S.C. 154(b) by 0 days.

(21) Appl. No.: 13/305,198

(22) Filed: Nov. 28, 2011

(65) Prior Publication Data
US 2012/0082538 A1   Apr. 5, 2012

Related U.S. Application Data

(63) Continuation of application No. PCT/EP2010/057428, filed on May 28, 2010.

(30) Foreign Application Priority Data

May 29, 2009   (DE) .................. 10 2009 024 239

(51) Int. Cl.
*B65G 59/04* (2006.01)
*B65G 59/02* (2006.01)
*B28D 5/00* (2006.01)
(52) U.S. Cl. ............ 414/416.03; 414/797.2; 414/331.17
(58) Field of Classification Search .............. 206/454, 206/833; 211/41.12, 41.18; 271/9.07, 9.11; 414/217, 222.01, 222.12, 225.01, 416.03, 414/416.07, 749.1, 751.1, 752.1, 795.8, 796.5, 414/796.9, 797, 797.2, 797.3, 222.11, 268, 414/269, 331.17, 416.08, 937, 940, 941
See application file for complete search history.

(56) References Cited

U.S. PATENT DOCUMENTS

| | | | | |
|---|---|---|---|---|
| 3,884,458 A | * | 5/1975 | Ryland | 271/9.02 |
| 4,526,501 A | * | 7/1985 | Blumle | 414/788.4 |
| 4,669,612 A | | 6/1987 | Mortensen | |
| 4,884,389 A | * | 12/1989 | McGregor | 53/571 |
| 5,054,418 A | * | 10/1991 | Thompson et al. | 118/500 |
| 5,658,028 A | * | 8/1997 | Bergam et al. | 294/27.1 |
| 5,904,464 A | * | 5/1999 | Han | 414/675 |
| 6,145,673 A | | 11/2000 | Burrows et al. | |
| 6,183,186 B1 | | 2/2001 | Howells et al. | |

(Continued)

FOREIGN PATENT DOCUMENTS

DE   10 2006 014136 A1   10/2007

(Continued)

OTHER PUBLICATIONS

International Preliminary Report on Patentability issued in connection with PCT/EP2010/057428.

*Primary Examiner* — Gregory Adams
(74) *Attorney, Agent, or Firm* — Akerman Senterfitt

(57) ABSTRACT

A device for stacking a plurality of silicon wafers has an upright machine carrier for holding a plurality of silicon wafers, the silicon wafers being provided in a horizontal position in the machine carrier. The device has three identical loading cassettes for introducing several silicon wafers therein. The machine carrier has holding devices for the loading cassettes. The loading cassettes have a lower support surface for putting silicon wafers on in stack-like fashion, and a rear side wall running substantially perpendicular thereto. The loading cassette is designed in such a way that the side opposite the rear side wall, and the top side are freely accessible.

26 Claims, 5 Drawing Sheets

U.S. PATENT DOCUMENTS

| | | | |
|---|---|---|---|
| 6,238,175 B1 * | 5/2001 | Gotz et al. | 414/795 |
| 6,669,253 B2 * | 12/2003 | Benzing et al. | 294/15 |
| 2003/0147728 A1 | 8/2003 | Tseng et al. | |

FOREIGN PATENT DOCUMENTS

| | | | |
|---|---|---|---|
| JP | 02155300 A * | 6/1990 | |
| JP | 4-142758 A | 5/1992 | |
| JP | 5-28043 U | 4/1993 | |
| JP | 05191086 A * | 7/1993 | |
| JP | 9-270449 A | 10/1997 | |
| JP | 2000-150523 A | 5/2000 | |
| KR | 1020060086752 A | 8/2006 | |
| WO | 89/10319 A1 | 11/1989 | |
| WO | 2008/061689 A2 | 5/2008 | |
| WO | 2008/106913 A2 | 9/2008 | |

* cited by examiner

DEVICE AND METHOD FOR STACKING AND/OR CONVEYING A PLURALITY OF FLAT SUBSTRATES

CROSS-REFERENCE TO RELATED APPLICATIONS

This application is a continuation of PCT Application No. PCT/EP2010/057428, filed May 28, 2010, and claims priority to DE 10 2009 024 239.2 filed May 29, 2009, the disclosures of which are hereby incorporated by reference in their entirety.

FIELD OF APPLICATION AND PRIOR ART

The invention relates to a device for stacking and/or for conveying a plurality of flat substrates such as, in particular, silicon wafers for solar cell production in accordance with the preamble of Claim 1. The invention also relates to a method for introducing a total amount of a large number of flat substrates into such a device.

After being removed from a substrate and sawed from a silicon block, silicon wafers for solar cell production are usually held in a bath with water or process solution. They are then taken out by hand, for example in subsets of approximately 50 to 100 units, and inserted into a machine carrier. They are introduced in a horizontal position in this process. The machine carrier is then let down vertically in upright fashion into a water bath, and with the aid of an automatic removal means such as, for example, a band conveyor, individual substrates are then removed from the machine carrier and fed to further processing, in particular final cleaning. In addition, the substrates are separated as completely as possible in this case. It is to be considered here as a problem that the wafers are gripped and inserted into the machine carrier by hand. The result is that there is a risk of damaging the very sensitive wafers.

OBJECT AND HOW IT IS ACHIEVED

It is an object of the invention to provide a device as mentioned before and a corresponding method, which are able to avoid disadvantages of the prior art and, in particular, enable the substrates to be introduced into the machine carrier safely and in a fashion fit for use that saves material.

This object is achieved by a device having the features of Claim 1, and by a method having the features of Claim 22. Advantageous and preferred refinements of the invention are subject matter of the further claims and will be explained in more detail below. Some of the features known below are enumerated only for the method or only for the device. However, irrespective thereof the aim is that they be valid both for the device and for the method. The wording of the claims is incorporated in the description by express reference.

It is provided that the device has an upright machine carrier for holding a plurality of the flat substrates as total amount. There can be up to 1000 such substrates, for example. The substrates are then located in a horizontal position in the machine carrier.

According to the invention, the device has at least one loading cassette or, advantageously two loading cassettes, in particular of similar type or identical, into which a fraction of the total amount of the substrates can be introduced. This can be around a quarter or a third of the total amount, by way of example. The machine carrier has holding devices for the loading cassette in order to fasten them, together with the substrates therein, in the machine carrier. A loading cassette is designed such that it has a lower support device on which the substrates can be put or on which they can be stacked. It also has a rear side wall running substantially perpendicular thereto and which holds the substrates in this direction as a type of vertical stack. The loading cassette is designed such that the side opposite the rear side wall, and the top side are freely accessible, that is to say, in particular, have no walls, supports or the like.

The inventive device can thus be used to introduce a relatively small number of substrates, for example the 100 units mentioned, into the loading cassette, it being possible, for example, to insert three times 100 units into the loading cassette. For this purpose, the loading cassette can even, in some circumstances, be dipped into the bath in which the substrates are located such that their mechanical loading and handling are particularly advantageous. After the loading cassette has been filled with the appropriate amount, it is introduced into the machine carrier such that ultimately the substrates are located in the machine carrier in a precisely prescribed alignment and/or position. This can advantageously take place in such a way that the loading cassettes are firstly introduced from the bottom upwards. There is thus no need for an entire machine carrier to be manipulated by hand or to be introduced with the substrates therein into a bath.

In one refinement of the invention, the base surface of the loading cassette or of the support device onto which the substrates are put can be not much larger than the surface of the substrates themselves. Consequently, the machine carrier need be designed to be only insubstantially or even not at all larger than to date. This relates chiefly to the width. Thus, not only can the loading cassettes be used with slightly modified, already available machine carriers, but their effect on the machine carrier is a not excessively high outlay, apart from the holding devices.

By way of example, a machine carrier can be designed to hold two or, advantageously, three loading cassettes one above another, possibly even four to six such loading cassettes. This also depends on the total amount of the substrates, or on their total weight. A subdivision should be carried out such that a loading cassette with the number of substrates provided for it can still effectively be moved by hand by an operator for the purpose of insertion into the machine carrier.

The loading cassettes in the machine carrier should occupy only so much space that removal means for separating and/or removing the uppermost substrates of the substrate stack can engage and/or move into the uppermost loading cassette. Such removal means are advantageously designed as usual or as known, in particular as band conveyors for removing the substrates by suction.

The support device on the loading cassette can be designed such that in one refinement of the invention it forms a surface, in particular a substantially continuous surface. This surface can be profiled to improve stability. Alternatively, the support device can have two support surfaces extending on the left-hand and right-hand sides, with a continuous cutout therebetween. The support surfaces are respectively provided on lateral supports, which then effect the substantial stability of the support device or of the loading cassette in this region. Said cutout can have at least 35% of the width of the loading cassette, preferably somewhat more, for example 50% to 70%. Furthermore, it can have a depth of at least the depth of a substrate, advantageously even somewhat more. The cutout has the advantage that later on, when individual substrates are being removed from the machine carrier from above, said removal means can be stationary and, so to say, engage in the machine carrier, and the latter is slowly moved upwards in order in each case to bring the substrates to the underside of the removal means. In this process, the removal means can then move through the loading cassettes in the machine carrier by means of the cutouts such that said loading cassettes need not be removed when they are empty.

A named lateral support can be profiled in its longitudinal direction in order to increase its stability. For this purpose, it can be singly or multiply angled as a single or multiple U-profile. By way of example, a said support profile can be formed on an intermediate limb, which points upwards, or lies at the top and which runs between two U-limbs and connects the latter. In a simple refinement of the invention, it is regarded as sufficient when two such somewhat widened support surfaces are provided to left and right for the substrates such that the cutout can be located therebetween. Such a lateral support can be led outside over the width of the loading cassette in a horizontal limb as a type of rail. This limb can then move into a corresponding, horizontal slot-type holding device in the machine carrier in order to secure the loading cassette.

In a further refinement of the invention, it is possible to provide on the loading cassette lateral supports, which connect the rear side wall thereof to the outer sides of the support device. They can, for example, be designed as side walls which advantageously have the total height of the rear side wall, but are not necessarily guided all the way to the front, that is to say are somewhat set back. Such lateral supports can improve the stability of the loading cassette and/or stabilize the angular arrangement between support surface and rear side wall. Moreover, they can effect a laterally exact positioning of the substrates in the loading cassette. It is likewise advantageous to provide in the direction of the rear side wall a stop, which can, for example, be arranged directly at the rear side wall, in particular near the outer side. Such a side wall can be continuous, or else have cutouts.

In a further refinement of the invention, the rear side wall is bent away from the support device or the substrates stacked thereon, or cambered. This camber can be designed to be relatively strong and has, for example, a quarter to a third of the width of the loading cassette. As previously described, as a result of the camber rearwards it is possible, firstly, for the removal beyond the substrates to move into the loading cassette. Furthermore, when the region of this camber is downwardly open to the rear, it is possible for broken substrates to fall out downwards and be divided from the separated substrates.

It can advantageously be provided that the rear side wall has at least one opening, particularly advantageously a plurality of horizontal slot-like openings. These can advantageously extend substantially over their entire width, also possibly be divided once. A plurality of such slot-like openings can be provided substantially over the entire height of the rear side wall. These openings serve the purpose of removing broken substrates and/or the individual parts thereof rearwards out of the loading cassette, and thus to the machine carrier.

For the purpose of better manipulation, a loading cassette can have gripping devices on the rear of at least one side, preferably to the left and right near the outer sides. Said devices can, for example, be designed as vertically extending handlebars, this being particularly good for holding and/or manipulating heavy loading cassettes.

In a development of the invention, locking devices can be provided in order to fasten or to lock a loading cassette after insertion into the machine carrier. Such locking devices are advantageously designed such that they can be operated with one finger without a large outlay on force, in particular for the purpose of locking. To this end, they can, for example, be provided near an above-described gripping device, for example in the upper region thereof in the case of vertical handlebars. Locking can thus be effected during the gripping of the gripping devices.

The holding devices on the machine carrier can advantageously be designed to be adjusted or height-adjusted. A machine carrier can therefore be adapted to loading cassettes of different sizes and heights.

In a further refinement of the invention, it can be provided that at least one retaining element is provided on the side of the machine carrier which is situated opposite the side where the loading cassette is inserted, that is to say on the open side. It advantageously runs vertically. When a loading cassette with substrates is being inserted, the retaining element serves the purpose of preventing it from falling out forwards, that is to say in the insertion direction.

A machine carrier can advantageously be designed as is known, that is to say consist of a lower plate and an upper plate which are connected by side walls and lateral stay bars. The said insertion side for introduction of the loading cassette into the machine carrier, and the opposite side, on which the substrates are removed, are advantageously substantially free.

A loading cassette can advantageously consist of fibre-reinforced plastic for the purpose of reducing weight. This also facilitates production in some circumstances. A multipartite loading cassette can be produced by bonding or screwing of a plurality of parts.

Apart from following from the claims, these and other features also emerge from the description and the drawing, it being possible that the individual features can respectively be implemented on their own or severally in the form of subcombinations in the case of an embodiment of the invention, and in other fields, and can constitute advantageous designs inherently worthy of protection and for which protection is claimed here. The subdivision of the application into individual sections and subheadings do not restrict the general validity of the statements made thereunder.

BRIEF DESCRIPTION OF THE DRAWINGS

Exemplary embodiments of the invention are illustrated schematically in the drawings and will be explained in more detail below. In the drawings.

DETAILED DESCRIPTION OF THE EXEMPLARY EMBODIMENTS

Figure 1:
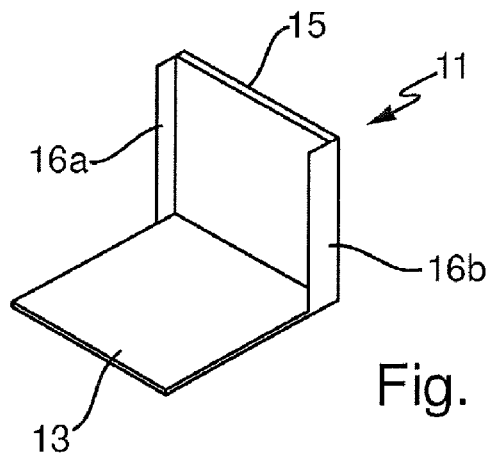
FIG. 1 shows an oblique view of a loading cassette illustrated in a simplified fashion.

Illustrated in simplified form in FIG. 1 is a loading cassette 11, which is substantially of angular design. It has a lower support surface 13 which, as illustrated here, is designed in the simplest case just to be continuous. It is designed to be rectangular or square in accordance with the shape of the substrates to be held. The loading cassette 11 has a rectangular rear side wall 15 running perpendicular to said substrates and is designed as a type of continuous wall. Also provided are two short side walls 16a and 16b which additionally on the one hand effect a better and more stable connection between support surface 13 and rear side wall 15. Furthermore, they serve as lateral stops for substrates, which are inserted into the loading cassette 11 and have substantially the area or at least the width of the support surface 13. The rear stop is formed by the rear side wall 15 itself.

The side walls 16a and 16b could be drawn yet further forwards, in some circumstances up to the front side of the support surface 13. This would, on the one hand, improve the stabilizing action. Furthermore, the action of the lateral stops for the substrates would also be improved thereby. It is also possible for such side walls to be designed to run obliquely.

Figure 2:
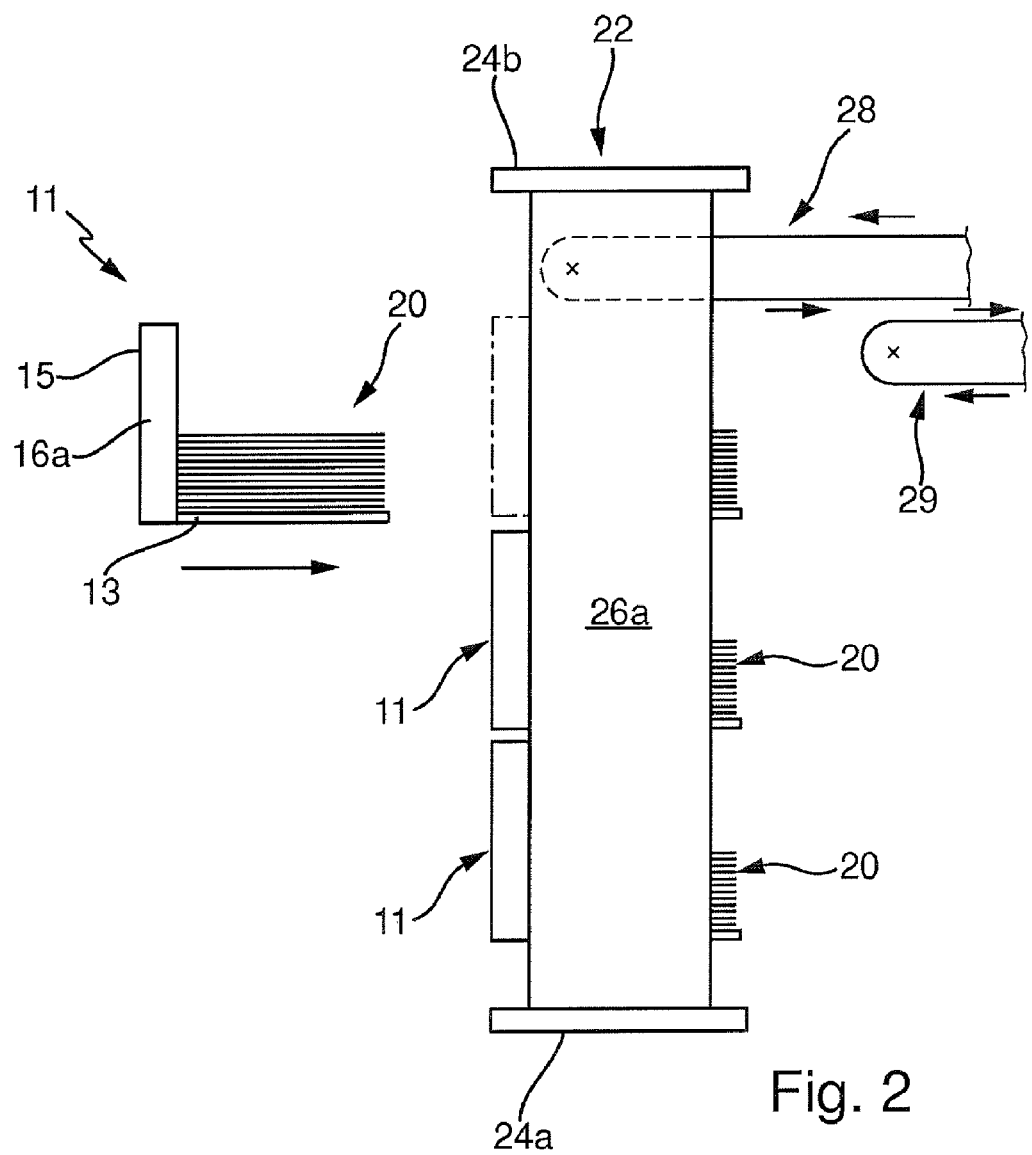
FIG. 2 shows a side view of the insertion of a plurality of loading cassettes into a machine carrier.

FIG. 2 illustrates how a loading cassette 11 in accordance with FIG. 1 is loaded with a plurality of flat substrates 20. In reality, the substrates 20 are directly on one another and are advantageously silicon wafers for the production of solar cells, for example having dimensions of 156 mm×156 mm. An above-mentioned subset of these substrates 20 is introduced into the loading cassette 11, or the substrates 20 are stacked on the support surface 13. It is to be seen that the stack of substrates 20 occupies approximately only half the height of the loading cassette 11, or that up to twice as many substrates 20 could be introduced. However, as has already been explained at the beginning, even for reasons of the total weight of loading cassette 11 and substrates alone, such a complete filling should usually be omitted.

FIG. 2 illustrates a machine carrier 22 such as is known per se in principle. A lower support plate 24a and an upper support plate 24b are connected by side parts 26a and 26b and form a type of frame that is completely open to the left and right in FIG. 2.

Two loading cassettes 11 have already been introduced into the lower region of the machine carrier and are held therein. By way of example, projecting lugs, guides, slide rails or the like can be provided on the inner sides of the side parts 26a and 26b for this purpose. The loading cassettes 11 are pushed in so far that they bear on the left with their side walls 16 against the rear lateral edge of the side parts 26. Both the support surfaces 13 and, above all, the substrates 20 project towards the right.

After being loaded with the loading cassettes 11 and thus with the substrates 20, the machine carrier 22 can be moved to a separating device which individually removes the substrates 20 and individually conveys them further for further processing. In a simple case, this can be a downward drop in a vertical direction, advantageously into a water bath. A removal means (here diagrammatically illustrated) in the form of a suction conveyor band 28 can then be brought into use. Said band is narrower than the spacing of the two side parts 26a and 26b in relation to one another, and therefore reaches into the machine carrier 22. It can be let down as far as the substrates 20, while it is possible as an alternative for the machine carrier 22 with the substrates to be moved correspondingly up to the suction conveyor band 28.

If all the substrates 20 of a loading cassette 11 are removed, it is then necessary either to remove the loading cassette 11 so that the support surface 13 enables the suction conveyor band 28 to be moved further as far as the next deeper stack of substrates 20. Alternatively, either the machine carrier 22 or the suction conveyor band 28 can be moved accordingly. In accordance with a yet further alternative refinement, it is possible to provide in the support surface 13 corresponding to FIG. 1 a central cutout which is illustrated and described in the other exemplary embodiment in accordance with FIGS. 3 and 4.

The suction conveyor band 28 removes the substrates 20 individually and then puts them onto a separating band 29 running thereunder. However, this is known in principle from the prior art and therefore need not be further explained.

Figure 3:
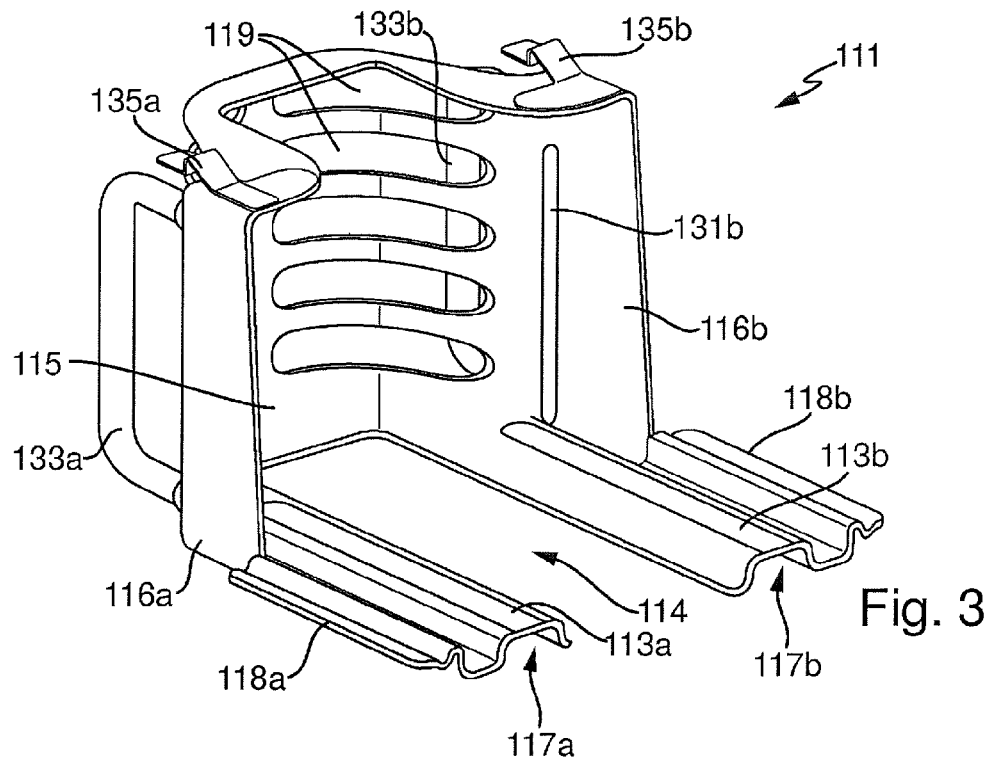
FIG. 3 shows a view obliquely from above of a specially designed loading cassette.

FIG. 3 illustrates a modified loading cassette 111 in the way it can be designed in particular, by way of example. A support surface is now subdivided into two divided support surfaces 113a and 113b with a far-reaching, central cutout 114 therebetween. The support surfaces 113a and 113b are, so to say, only wide strips, but suffice for substrates to be sufficiently safely put on them in a way corresponding to FIG. 2.

Above all, the support surfaces 113 are provided on lateral supports 117a and 117b, which are profiled or multiply corrugated in a longitudinal direction. Their stability can be substantially improved thereby. Outside laterally on the lateral supports 117, the latter are designed as longitudinal rails 118a and 118b, which run in a single, horizontal plane and project in lateral fashion substantially beyond side walls 116a and 116b. The longitudinal rails 118 serve the purpose of inserting the loading cassette 111 into corresponding grooves or onto previously described guide rails or the like in the machine carrier, which will be explained in yet more detail below.

To the rear, the lateral supports 117a and 117b come together behind the rear end of the cutout 114 and are drawn upwards or merge into a rear side wall 115. As becomes clear from FIG. 4, in particular, this rear side wall 115 is not of flat design and closed as illustrated in FIG. 1, but is cambered strongly rearwards. The effect of this is that it always runs behind the cutout 114 and thus permits a suction conveyor band in accordance with FIG. 2 to move through. Furthermore, its stability can thereby be improved yet further. Downwards, the rear side wall 115 merges precisely without the transition and in a rounded fashion into the lateral supports 117 or the rear edge of the cutout 114.

Figure 4:
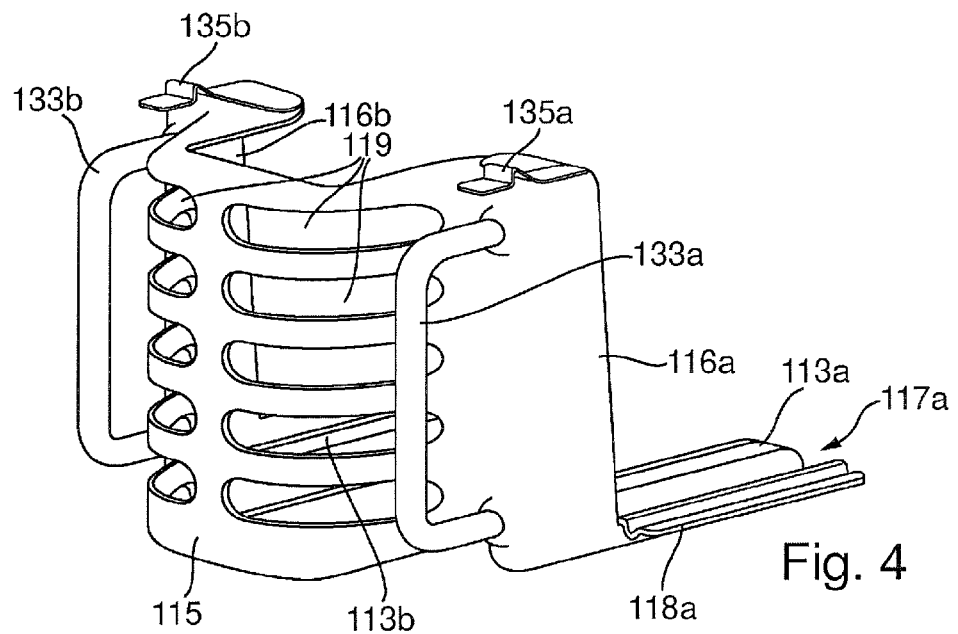
FIG. 4 shows a view obliquely from the rear and from above of the loading cassette from FIG. 3.

Above all, it is also to be seen from FIG. 4 that slot-like openings 119 are provided on the rear side wall 115. Said openings are divided in the middle or do not extend over the entire width of the rear side wall 115, in order to increase the stability. Nevertheless, the openings 119 in the rear side wall 115 occupy approximately half the edge area. Alternatively, they are continuous.

It is to be seen from FIG. 3 that vertically running stop strips 131 run in the transition between the rear side wall 115 and the side walls 116a and 116b. Said stop strips serve as stop for inserted substrates in the direction of the rear side wall 115. Like the support surfaces 113a and 113b, they can consist of another material than the loading cassette 111 itself, and/or be coated or surfaced, for example with materials that are more wear resistant or softer, in order to protect the substrates.

Provided on the outer sides of the rear side wall 115 are two grips with the aid of which the loading cassette 11 can be gripped and moved, particularly when it is loaded with substrates.

Locking devices 135a and 135b are provided on the top side of the rear side wall 115, which is drawn somewhat forwards and inwards and is also connected to a top edge of the side walls 116. Such a design is known in principle, and the locking devices 135 serve the purpose of securing the loading cassette 11 in a machine carrier after being inserted therein. If the locking devices 135 are pressed downwards, a loading cassette 111 can also be removed again. It is to be seen that the arrangement of the locking devices 135 near the grips 133 enables easy operation by thumb, that is to say while the loading cassette 111 is being securely held.

The openings 119 serve to enable broken substrates or their individual parts to fall out rearwards, that is to say approximately in a horizontal direction, as it were, and not to cause a disturbance. It is true that continuous openings would be even better for this purpose, but they would excessively impair the stability of the loading cassette 111. A similar function is performed by the cutout 114 with the region that is drawn far to the rear and reaches up to just in front of the rear side wall 115. Here, such fragments could fall directly downwards and thereby likewise be removed from the loading cassette 111.

Figure 5:
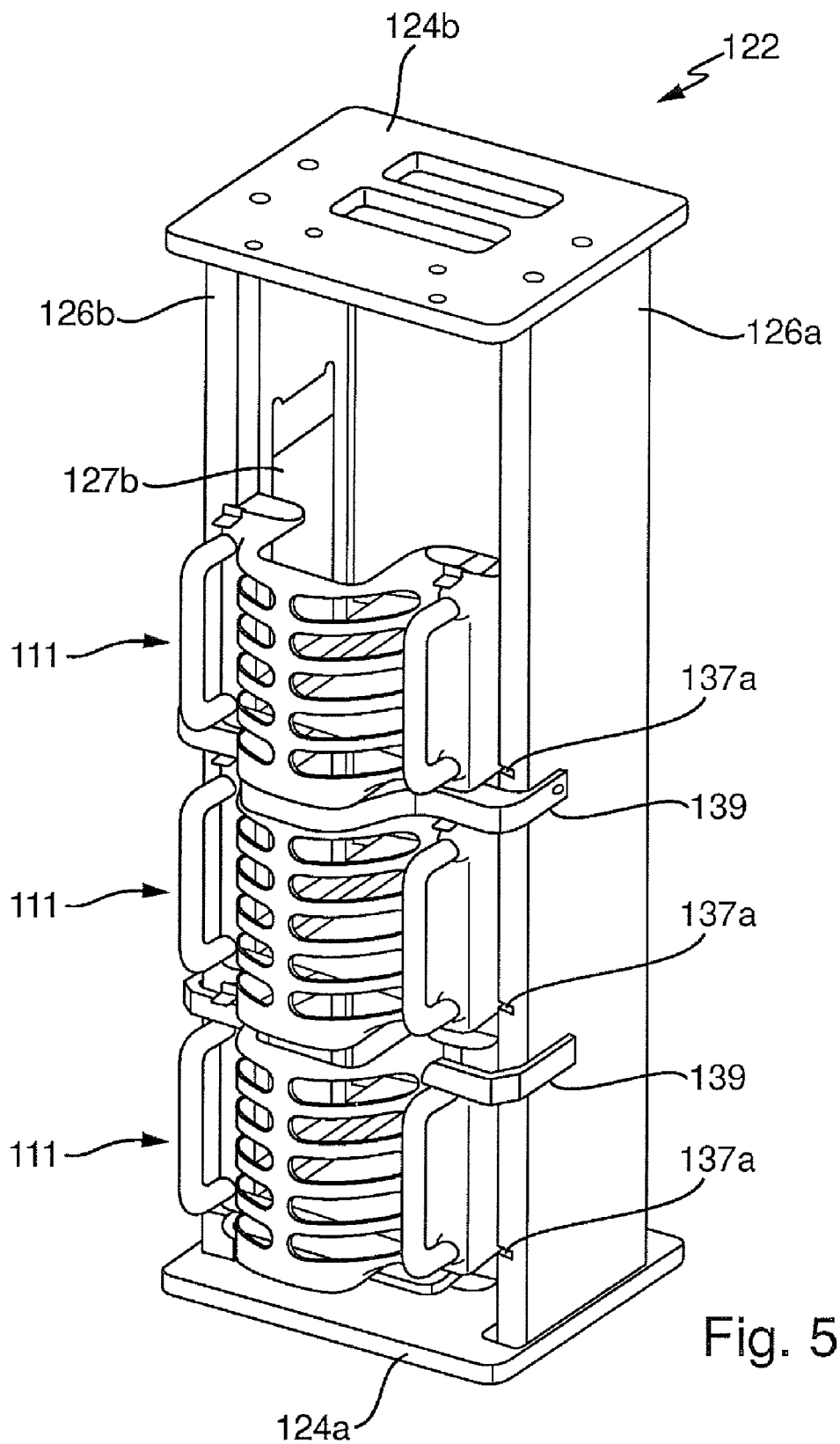
FIG. 5 shows a view obliquely from the rear of an inventive device with a machine carrier into which three loading cassettes are inserted in a way similar to FIG. 2.
Figure 6:
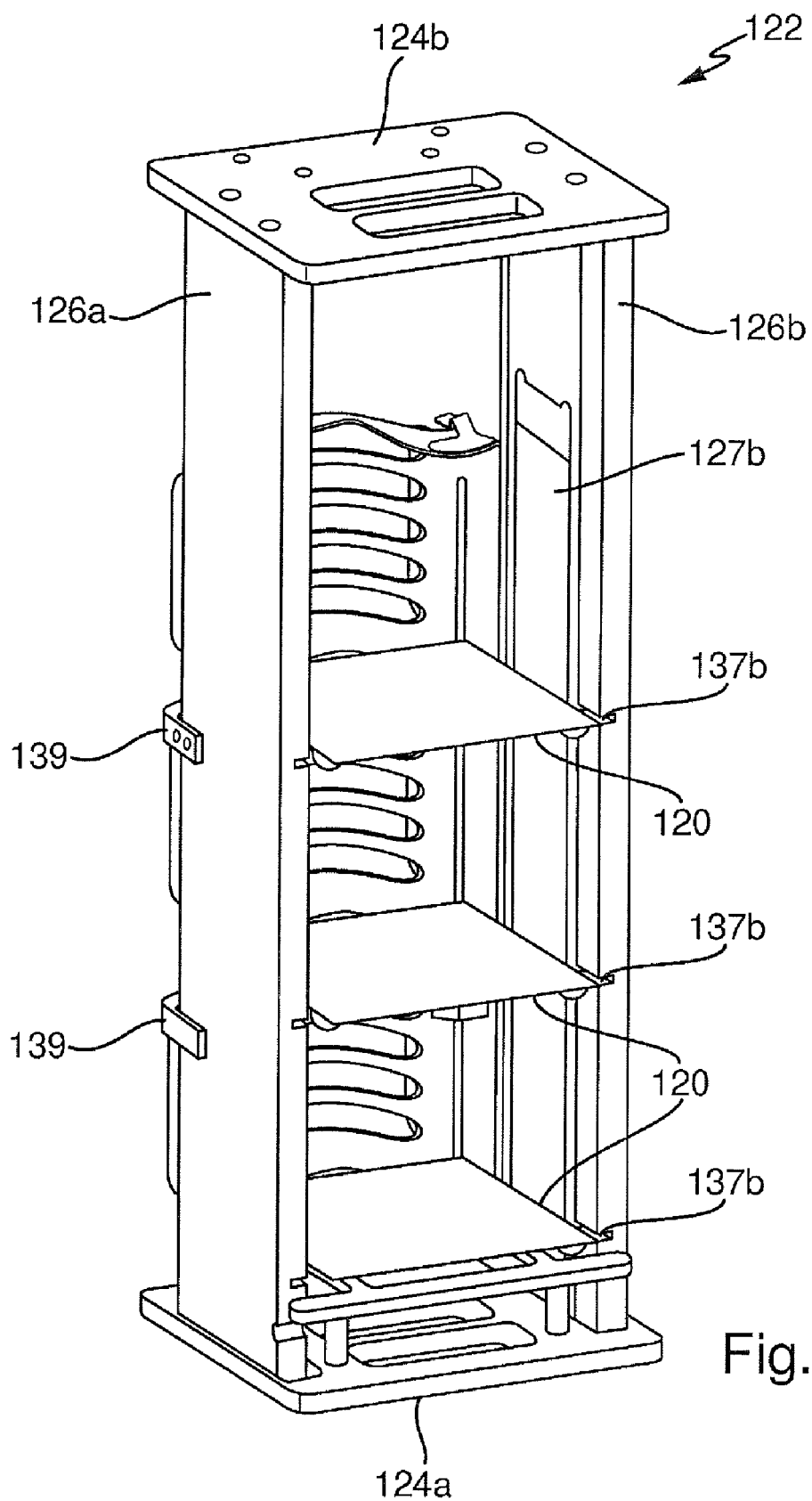
FIG. 6 shows the arrangement from FIG. 5, obliquely from the front with in each case one substrate put down on the loading cassettes.

FIGS. 5 and 6 illustrate how three loading cassettes 111 in accordance with FIGS. 3 and 4 are introduced into a machine carrier 122. On the holding devices mentioned at the beginning, the machine carrier 122 has on the inner sides of the lateral parts 126a and 126b single horizontal, slot-type grooves 137 which extend over the entire width of the lateral parts 126. Such grooves 137 can be provided at specific points, and this then enables the loading cassette 11 to be inserted precisely in this position. It is also possible to provide far more than the three grooves 137 illustrated, and this then in principle enables insertion at different heights.

Also provided are locking stirrups 139, at least over the lowest and over the second lowest loading cassette 111. They are fastened laterally outside on the lateral parts 126a and 126b and the course of their extent corresponds to that of the rear side wall 115 in the loading cassette 111 over the width thereof. The locking devices 135 of the loading cassettes 111 can engage and/or lock the locking stirrups or the underside thereof. For the sake of clarity, no illustration of such a locking stirrup has been given above the uppermost loading cassette 111. Such locking stirrups 139 can also be provided at appropriate bores or the like at a different height.

It is also illustrated how sliding layers 127a and 127b are provided on the inner sides of the lateral parts 126a and 126b. Said layers consist, for example, of thin, ceramic inserts which are bonded on the inner side of the lateral parts 126 and prevent the possibly sharp lateral edges of inserted substrates from damaging the material permanently.

FIG. 6 illustrates how one substrate 120 in each case rests on each of the support surfaces 113 of the loading cassette 111. These substrates 120 bear in this case against the stop strips 131 with their rear edge. Also to be seen from this illustration is the fact that fragments of such substrates can either be removed in a horizontal direction rearwards through the openings 119 in the rear side walls 115 or, since the machine carrier 122 is then located in a water bath together with substrates 120, can be flushed out. Alternatively, they can fall downwards through the rear regions, withdrawn to the rear, of the cutout 114 between the support surfaces 113a and 113b. It is true that in this case the fragments fall from the uppermost loading cassette 111 into the loading cassettes lying therebelow. However, in practice they will simply likewise fall through the latter, and this then is likewise not a problem.

The figures do not illustrate the previously named retaining elements. By way of example, in the illustration of FIG. 6 these can be provided in front of that side of the machine carrier 122 which is open from the plane of the drawing, for example as elongated bars which are fastened at the top and bottom on the support plates 124a and 124b. They can, for example, run in accordance with the course of the stop strips 131, but such a retaining element is also possible here only on one side. It is then advantageously possible after completion of the insertion of the loading cassettes 111 into the machine carrier 122 for said retaining element to be removed, specifically either completely removed or, for example, pivoted to the side. This enables the removal of the individual substrates 120 with the aid of a previously described suction conveyor band.

Figure 7:
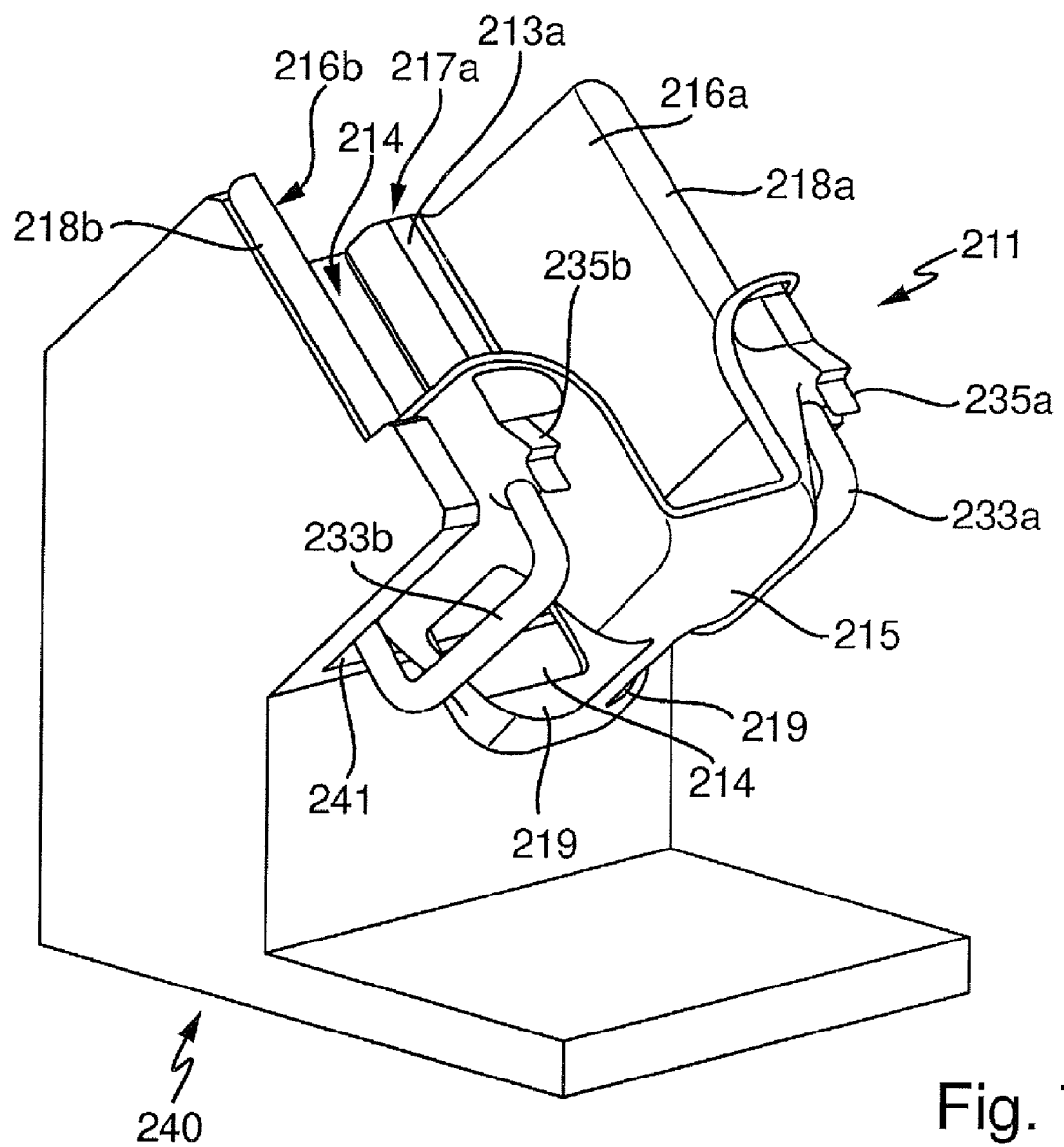
FIG. 7 shows a somewhat modified loading cassette in a loading device.

FIG. 7 shows a loading cassette 211 of somewhat different design. Proceeding from the loading cassettes illustrated in FIGS. 3 and 4, said cassette differs to the extent that the side walls 216a and 216b are drawn out from the rear side wall 215 over the entire height as far as the foremost end of the lateral supports 217a with support surfaces 213a. It is thereby possible to improve the lateral guidance of substrates, which are to be inserted, which has been addressed previously. A cutout 214 is likewise provided between the lateral supports 217. Provided on the rear side wall 215 are grips 233a and 233b and, thereabove, once more locking devices 235a and 235b.

As a further modification, the rear side wall 215 has two large openings 219 which are, in turn, separated by a web for the purpose of better stability. Since the side walls 216 now adjoin the lateral supports 217 on the outside, the longitudinal rails 218a and 218b are in this case provided, for the sake of simplicity, as lengthened side walls on the upper region thereof, specifically by bending the side walls up and outwards. In this case, holding devices and the grooves in the machine carrier in accordance with FIG. 5 are provided at a correspondingly different site.

Illustrated in FIG. 7 as a further particular feature is the fact that the loading cassette 211 is inserted into a loading device 240. As may be recognized, the loading device 240 is designed such that the loading cassette 211 can be inserted obliquely from above into a rail-like or U-like holder 241. It thereby continues to be effectively accessible from above, and inserted substrates slide under their own weight up to stop strips (not illustrated here) which are likewise provided as in FIG. 3. It is thereby possible to substantially simplify the operation of loading the loading cassette 211 with substrates, both for an operator and for the substrates. In order to remove a filled loading cassette 211, it can either be withdrawn or lifted out in the direction of the lateral supports 217, or else simply withdrawn or lifted out vertically upwards.

A further advantage of the side walls 216, particularly when they are drawn far forwards in accordance with FIG. 7, specifically, by way of example, to exactly the same length as the support surfaces or the lateral supports, resides in the fact that it is likewise possible in this region for the substrates to be held in a self-closed fashion, as it were. It is then even less likely that fragments of these substrates can come between loading cassette and machine carrier or lateral parts of the machine carriers, where they could impair the function.

The aim of providing at least one loading cassette in the machine carrier is to reduce mechanical stress exerted on the substrates or wafers, and also to reduce the risk of breakage. This is also achieved, inter alia, by virtue of the fact that the total amount of the substrates stacked one above another is reduced and that the height of the stack is reduced. For this purpose, in some circumstances even a plurality of supporting devices is the manner of intermediate bases can be provided for each loading cassette. Again, loading which is possible in accordance with the invention is associated with a lower risk of breakage when the substrates can be reloaded with as few manual steps as possible and, above all, need no longer be pressed together.

The invention claimed is:

1. A device for stacking and conveying a plurality of flat substrates, comprising:
   an upright machine carrier for receiving a plurality of said flat substrates in a horizontal position, and at least one loading cassette for introducing a stack of a part of said plurality of substrates therein, said at least one loading cassette having a lower support device for supporting the stack of substrates, a rear side wall running substantially perpendicular to said lower support device, a front side opposite said rear side wall, and a top side, said front side and said top side being freely accessible and said front side being a substrate unloading side, wherein the machine carrier comprises receiving devices for receiving said at least one loading cassette and is configured to receive the at least one loading cassette by inserting the at least one loading cassette with its front side first at a first open side of the machine carrier opposite a second open side of the machine carrier.

2. The device according to claim 1, wherein a base surface of said loading cassette or of said support device is only insubstantially larger than a surface of one of said substrates to be introduced therein.

3. The device according to claim 1, wherein said machine carrier is designed for holding two or three of said loading cassettes one above another, and has said holding devices therefor.

4. The device according to claim 1, wherein said loading cassettes have only a slight spacing from one another, wherein there is sufficient space above an uppermost loading cassette for intervention of a separating device for separating or removing an uppermost substrate of said substrate stack in said loading cassette.

5. The device according to claim 1, wherein said support device has two support surfaces extending on a left-hand and a right-hand side and have a continuous cutout therebetween.

6. The device according to claim 1, wherein said support surfaces are provided in each case on lateral supports of said support device.

7. The device according to claim 5, wherein said cutout therebetween has at least 50% of a width of said loading cassette.

8. The device according to claim 5, wherein said cutout has a depth of at least the depth of a substrate.

9. The device according to claim 5, wherein a lateral support is profiled in a longitudinal direction by being singly or multiply angled in a form of at least one single U-profile.

10. The device according to claim 9, wherein said support surface is formed on an upwardly pointing intermediate limb of said U-profile.

11. The device according to claim 1, wherein lateral supports are provided on said loading cassette in a fashion directed from said rear side wall of said loading cassette to lateral outer sides of said support device.

12. The device according to claim 11, wherein said lateral supports are formed as a substantially continuous side wall.

13. The device according to claim 1, wherein said rear side wall of said support device is bent outwardly.

14. The device according to claim 13, wherein said rear side wall has one or more horizontal openings extending over a large part of its width.

15. The device according to claim 1, wherein on at least one side, said loading cassette has gripping devices outside on said rear side wall.

16. The device according to claim 15, wherein said gripping devices have substantially vertically running handlebars.

17. The device according to claim 1, wherein locking devices are provided for locking said loading cassette in said machine carrier after being inserted therein.

18. The device according to claim 17, wherein said locking devices are designed to be operated with one finger.

19. The device according to claim 17, wherein said locking devices are provided near a gripping device of said loading cassette.

20. The device according to claim 1, wherein a holding device for said loading cassette on said machine carrier is designed such that it is adjustable or height-adjustable.

21. A method for stacking or conveying a plurality of flat substrates using a device according to claim 1, comprising:
 loading a part of said plurality of substrates in a first loading cassette,
 arranging the loading cassette in the machine carrier by inserting it with its freely accessible front side first into the machine carrier at a first open side thereof, and
 repeating one or several times the steps of loading a part of the plurality of substrates into a next loading cassette and of moving said next loading cassette into the machine carrier.

22. The method according to claim 21, wherein said loading of said loading cassette with said substrates takes place in water.

23. The method according to claim 22, wherein said loading of a plurality of loading cassettes into said machine carrier takes place sequentially.

24. The method according to claim 21, wherein said machine carrier is arranged above a water bath and is movable essentially in a vertical direction, one said loading cassette being moved as far as possible downwards into the water bath after being introduced into said machine carrier in order to wet said introduced loading cassette and said substrates located therein, said insertion of a next higher one of said loading cassettes taking place substantially outside said water bath.

25. The method according to claim 21, wherein substantially fixed removal means move into said machine carrier in order to separate said substrates from a stack above said uppermost loading cassette and remove individual substrates from top to bottom.

26. The method according to claim 25, wherein said removal means move through cutouts in accordance with claim 5 into said support devices during movement of said machine carrier in a vertical direction.

* * * * *